United States Patent [19]
Baumgartner et al.

[11] Patent Number: 5,663,689
[45] Date of Patent: Sep. 2, 1997

[54] METHOD AND APPARATUS FOR PROVIDING A HIGH SPEED CHARGE PUMP WITH LOW STATIC ERROR

[75] Inventors: Steven J. Baumgartner; Rick A. Philpott, both of Rochester; David W. Siljenberg, Byron, all of Minn.

[73] Assignee: International Business Machines Corporation, Armonk, N.Y.

[21] Appl. No.: 673,725

[22] Filed: Jun. 26, 1996

[51] Int. Cl.[6] .............................. H03L 7/089; H03G 3/20
[52] U.S. Cl. .............................. 331/17; 331/8; 331/25; 327/157; 330/281; 455/234.1
[58] Field of Search .................. 331/1 A, 8, 15, 331/17, 25, DIG. 2; 327/157; 455/234.1; 330/278, 279, 280, 281

[56] References Cited

U.S. PATENT DOCUMENTS

| | | | |
|---|---|---|---|
| 4,636,748 | 1/1987 | Latham, II | 331/17 |
| 4,885,554 | 12/1989 | Wimmer | 331/25 |
| 4,987,387 | 1/1991 | Kennedy et al. | 331/1 A |
| 5,126,692 | 6/1992 | Shearer et al. | 331/8 |
| 5,166,641 | 11/1992 | Davis et al. | 331/1 A |
| 5,208,546 | 5/1993 | Nagaraj et al. | 328/155 |
| 5,285,114 | 2/1994 | Atriss et al. | 307/264 |
| 5,319,320 | 6/1994 | Abe et al. | 331/1 A |
| 5,363,066 | 11/1994 | Chen et al. | 337/17 |
| 5,384,502 | 1/1995 | Volk | 327/157 |
| 5,416,691 | 5/1995 | Croughwell | 363/60 |
| 5,424,689 | 6/1995 | Gillig et al. | 331/17 |
| 5,548,833 | 8/1996 | Townsend | 330/280 X |
| 5,592,120 | 1/1997 | Palmer et al. | 331/17 X |

OTHER PUBLICATIONS

M. B. Ebler, D. W. Siljenberg and J. T. Trnka, "Charge Pump," *IBM Technical Disclosure Bulletin*, vol. 33, No. 4, Sep. 1990, pp. 252–254.

R. D. Gillingham, J. F. Mikos and J.D. Strom, "Differential Charge Pump," *IBM Technical Disclosure Bulletin*, vol. 33, No. 9, Feb. 1991, pp. 332–333.

*Primary Examiner*—David Mis
*Attorney, Agent, or Firm*—David W. Lynch

[57] ABSTRACT

A charge pump that receives complimentary metal-oxide semiconductor (CMOS) input signals, has high noise immunity, low static error and works at low power supply voltages. The charge pump includes a current switch for receiving a control signal from a control circuit and for generating a charge signal, a loop filter having a first and second node, and a common-mode loop for sensing the charge signal from the current switch and for providing a voltage level adjustment signal to the first node of the loop filter in response thereto. The common-mode loop includes a sensing circuit for sensing the voltage level at the first and second node, an averaging circuit for producing an averaged voltage signal, a comparing circuit for comparing the averaged voltage signal to a reference signal to produce a feedback control output signal, and a feedback current source for adjusting the voltage level at the first node of the loop in response to the feedback control output signal.

32 Claims, 5 Drawing Sheets

5,663,689

METHOD AND APPARATUS FOR PROVIDING A HIGH SPEED CHARGE PUMP WITH LOW STATIC ERROR

GOVERNMENT RIGHTS

This invention was made with government support under Cooperative Agreement F33615-94-2-1582 awarded by the U. S. Department of Air Force. The government has certain rights in the invention.

BACKGROUND OF THE INVENTION

1. Field of the Invention

This invention relates in general to a charge pump, and more particularly, to a charge pump having low static error characteristics.

2. Description of Related Art

Phase-locked loop (PLL) circuits and gain control loops are widely used in electronic systems today. For example, phase-locked loops may be used for clock recovery and frequency synthesis while gain control loops are used to maintain an output signal at a predetermined level. Nevertheless, applications of such circuits continue to make more stringent demands in terms of the noise immunity and static error performance.

More particularly, by way of example, a phase detector may detect any phase difference between an input signal and the output signal of a voltage controlled oscillator (VCO) and generate control signals to minimize the phase difference in a phase-locked loop circuit. The PLL may employ a charge pump circuit which responds to control signals from the phase detector to modulate the amount of charge stored in a loop filter between the charge pump circuit and the voltage controlled oscillator. The output voltage of the loop filter controls the voltage controlled oscillator frequency.

In a phase-locked loop circuit used to synchronize data input with clock signals, the voltage controlled oscillator output constitutes the clock signal which must be matched in frequency and phase to the input data signal. A frequency detector detects the difference in frequency between the voltage controlled oscillator clock output and reference signal. If the voltage controlled oscillator clock frequency is slower than the data signal, the charge pump charges up and increases the voltage controlled oscillator output frequency. If the voltage controlled oscillator clock frequency is faster, the charge pump charges down and decreases the voltage controlled oscillator output frequency. After the frequency matching or acquisition operation is done, a phase detector acts to match the phase of the data signal and clock. The charge pump combines the signal from both the phase detector and frequency detector to drive the voltage controlled oscillator.

It is important to match the charge and discharge currents in the charge pump circuit. A mismatch in the two currents results in static error between the input signal and the output signal of the voltage controlled oscillator. This static error can be a serious problem in many systems. For example, the bit error rate in the read channel of a disk sub-system may be strongly affected by the static error. This mismatch can only be minimized by minimizing the mismatch between the charge and discharge currents from the charge pump circuit.

To achieve high noise immunity in the charge pump, a differential design is needed. Existing differential designs use emitter or source coupled differential pairs to switch current to the loop filter or to the current supply. Thus, they dissipate power in the switches even during the states where no corrections were being issued. Another downfall to these designs is that mismatches in the differential-mode or common-mode feedback stages result in static error due to gain variation of the amplifier. Also, these charge pumps require emitter-coupled logic (ECL) signals instead of complimentary metal-oxide semiconductor (CMOS) inputs.

Other complimentary metal-oxide semiconductor (CMOS) charge pump designs that are known about are single ended designs, have excessive jitter due to current switch overshoot, and lack any common-mode references.

Nevertheless, attempts have been made to provide constant charge and discharge currents with minimal overshoot. For example, U.S. Pat. No. 5,363,066, issued to Chen et al., entitled "FAST CMOS CHARGE PUMP CIRCUIT", and incorporated by reference herein, discloses a charge pump circuit which includes a feedback circuit coupled to the level shifter for comparing the output voltage of the charge pump to predetermined first and second reference voltages. However, Chen still suffers from significant static error.

It can be seen then that there is a need for a charge pump that receives complimentary metal-oxide semiconductor (CMOS) input signals, has high noise immunity, low static error and works at low power supply voltages.

SUMMARY OF THE INVENTION

To overcome the limitations in the prior art described above, and to overcome other limitations that will become apparent upon reading and understanding the present specification, the present invention discloses a charge pump that receives complimentary metal-oxide semiconductor (CMOS) input signals, has high noise immunity, exhibits low static error and works at low power supply voltages.

The present invention solves the above-described problems by providing a method and apparatus for providing a high speed charge pump with a common-mode loop that provides low static error.

A system in accordance with the principles of the present invention includes a current switch for receiving a control signal from a control circuit and for generating a charge signal, a differential loop filter having a first and second node, and a common-mode loop for sensing the charge signal from the current switch and for providing a voltage level adjustment signal to the first node of the loop filter in response thereto.

One aspect of the present invention is that the charge signal may be a signal for increasing the voltage at the first node and decreasing the voltage at the second node.

Another aspect of the present invention is that the charge signal may be a signal for decreasing the voltage at the first node and increasing the voltage at the second node.

Another aspect of the present invention is that the common-mode loop may include a sensing circuit for sensing the voltage level at the first and second node, an averaging circuit for producing an averaged voltage signal, a comparing circuit for comparing the averaged voltage signal to a reference signal to produce a control output signal, and a feedback current source for adjusting the voltage level at the first node of the loop in response to the control output signal.

Another aspect of the present invention is that the current switch may include a first differential pair and a second differential pair, wherein the first differential pair increases the voltage at the first node and the second differential pair decreases the voltage on the second node of the loop filter, in response to an increase control signal.

Yet another aspect of the present invention is that the current switch may include a first differential pair and a second differential pair, wherein the first differential pair increases the voltage at the second node and the second differential pair decreases the voltage on the first node of the loop filter, in response to a decrease control signal.

Another aspect of the present invention is that the charge pump further includes an inverter for receiving the control signal to provide an inverted control signal to the current switch, provide source resistance to the current switch for maintaining current balance and reduce overshoot of the charge pulses to the filter.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiments, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

In accordance with this invention, a charge pump provides low static error, high noise immunity, and works at low power supply voltages.

Figure 1:
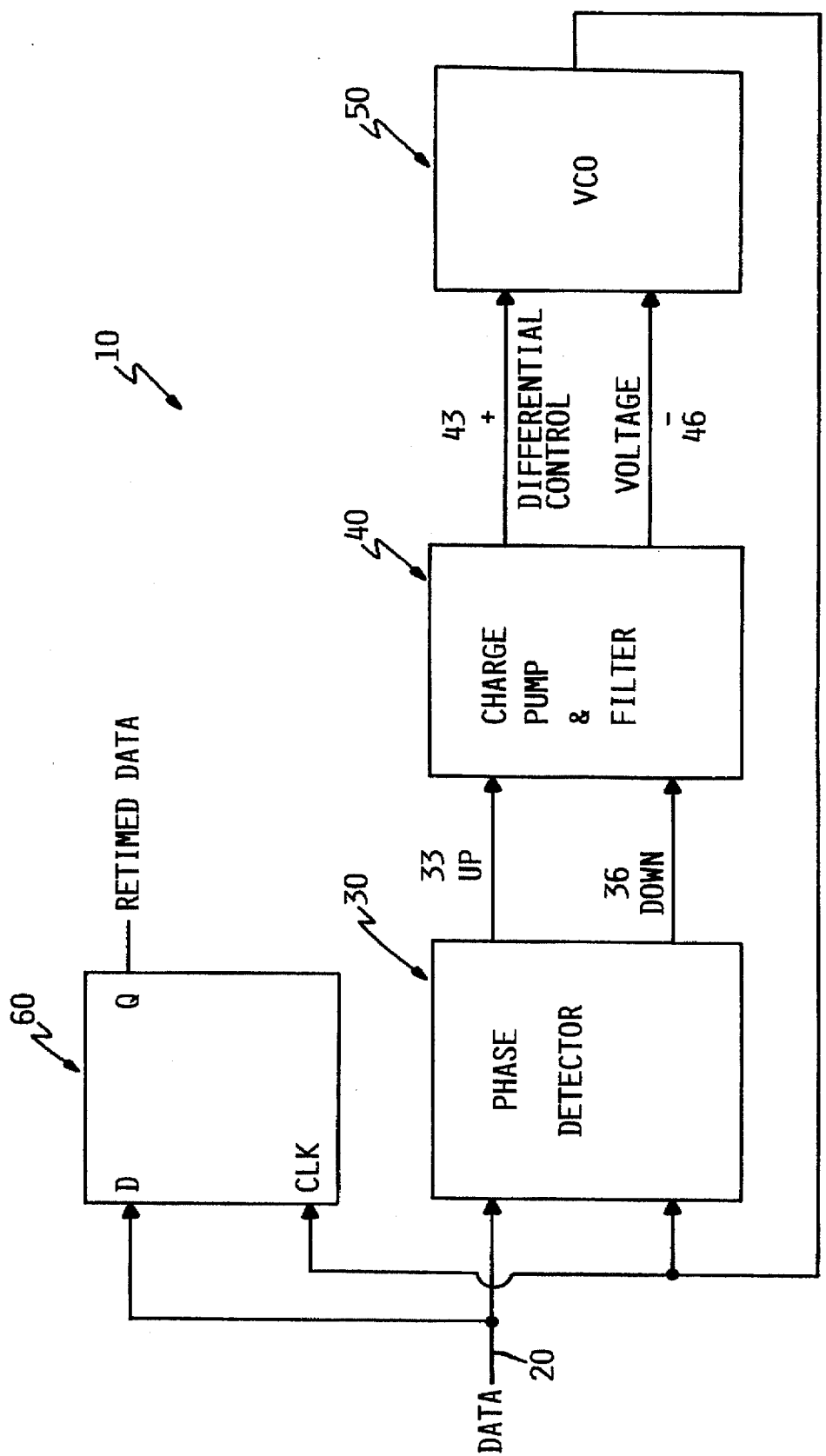
FIG. 1 is a block diagram of a phase-locked loop according to an embodiment of the present invention.

As embodied herein, and illustrated in the figures, an exemplary charge pump system incorporated in a phase-locked loop circuit 10 is shown in FIG. 1. However, those skilled in the art will recognize that the charge pump according to the invention is not meant to be limited to use in a phase-locked loop circuit. Other applications in accordance with the invention are possible. For example, the charge pump may also be implemented in other control loop circuits such as a gain control loop as illustrated and discussed with FIG. 5 below.

In FIG. 1, a data source, which is not shown, provides a data signal 20 as a first input to a phase detector 30 in the phase-locked loop (PLL) 10. A second input signal 55 to the phase detector 30 is provided as feedback from the output of a Voltage Controlled Oscillator (VCO) 50. The phase detector 30 generates a differential pump up signal 33 or a differential pump down signal 36, which are a function of the sum and difference of the phase of the first and second input signals, to a charge pump and loop filter 40. The charge pump and loop filter 40 provide differential control voltage signals 43 and 46 to the voltage controlled oscillator 50.

As mentioned above, the output of the voltage controlled oscillator 50 is provided to close the loop as the second input signal 55 to the phase detector 30. The data signal 20 is also input to a retiming device such as a D-type flip-flop 60. Further, the voltage controlled oscillator output 55 is also routed to the D-type flip-flop 60 as a clock for the data signal retiming.

Figure 2:
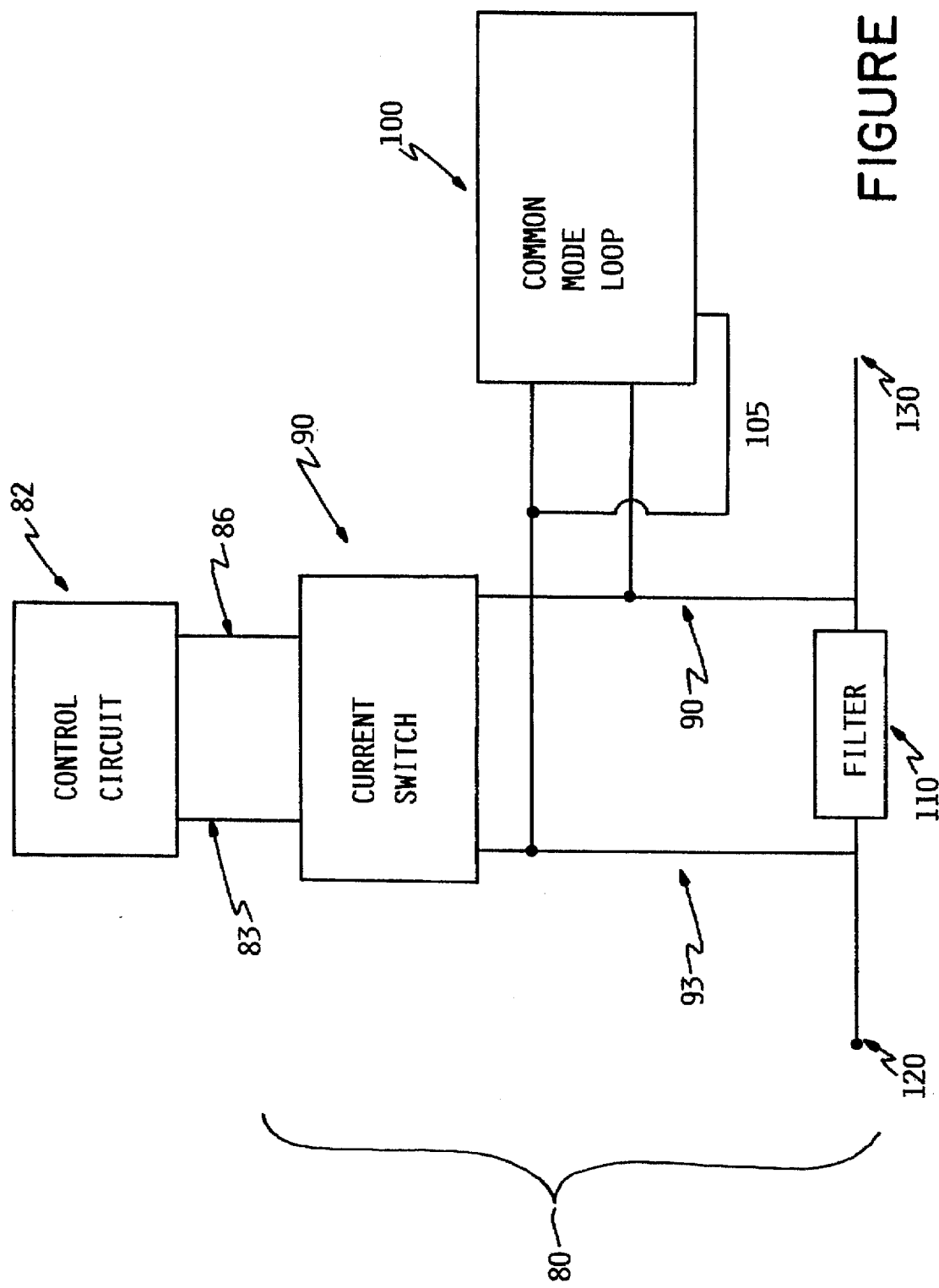
FIG. 2 is a block diagram of a charge pump according to an embodiment of the present invention.

In the particular embodiment of a charge pump 80 of this invention illustrated in FIG. 2, a control circuit 82, such as a phase detector as illustrated in FIG. 1, provides differential control signals 83 and 86 to a current switch 90.

In accordance with the invention, the charge pump 80 includes a loop filter 110 coupled to the current switch 90. The loop filter 110 includes a first 120 and second node 130. The current switch 90 adjusts a voltage at the first 120 and second 130 node in response to a signal from the control circuit 82. In the particular embodiment illustrated in FIG. 2, the current switch 90 provides two charge signals 93 and 96 to the loop filter 110.

In accordance with the invention, the charge pump 80 includes a common-mode loop 100 coupled to the current switch 90 for sensing the charge signals 93, 96 from the current switch 90 and for providing a voltage level adjustment signal 105 to the first node 120 of the loop filter 110 in response thereto. Thus, the common-mode loop 100 provides a feedback signal 105 that increases or decreases the voltage level of the charge signal 93 to the loop filter 110 on the first node 120 of the loop filter 110.

Figure 3:
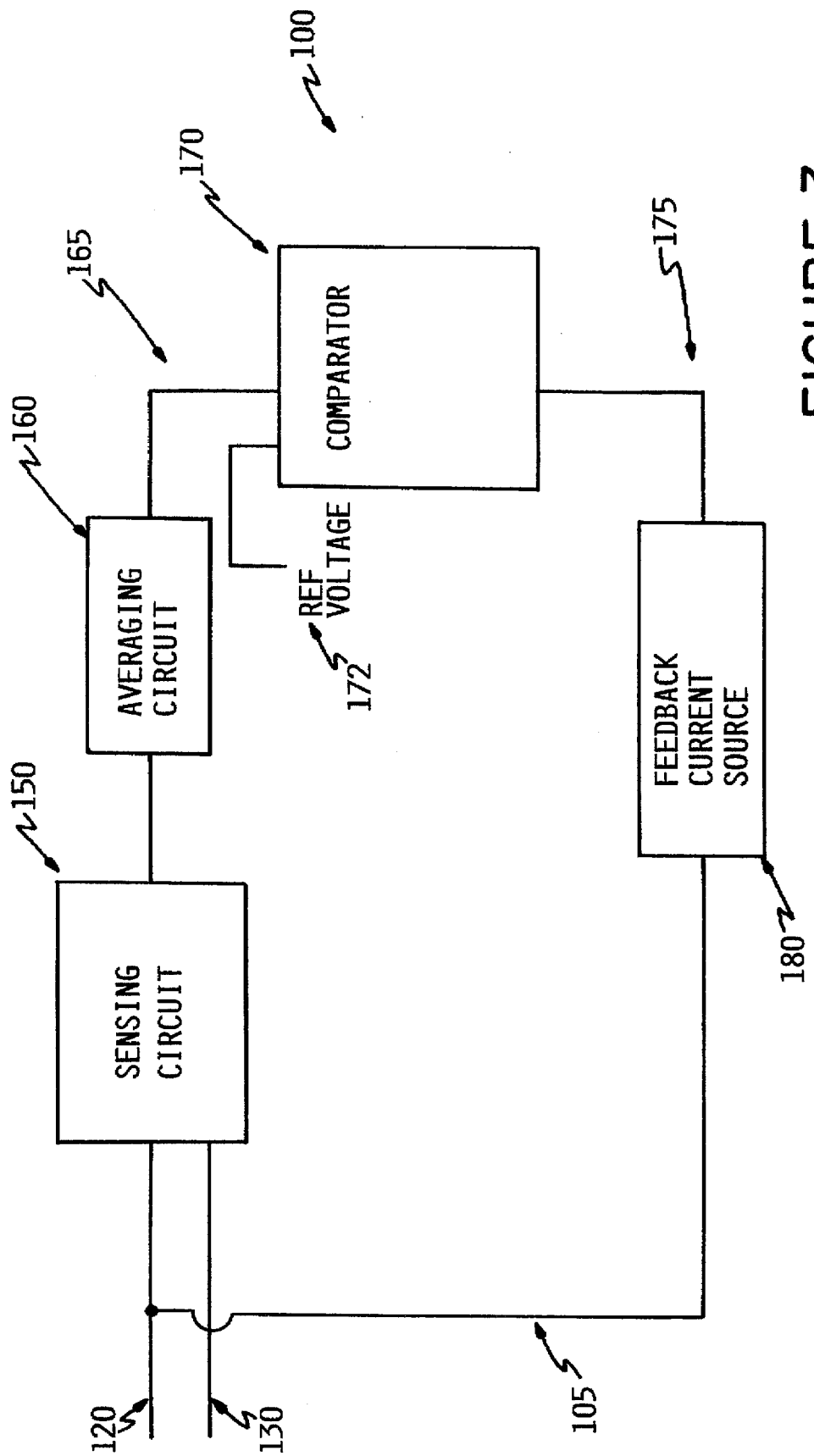
FIG. 3 is a block diagram of a common-mode loop according to an embodiment of the present invention.

The common-mode loop 100 shown in FIG. 2 is illustrated in more detail with reference to FIG. 3. The common-mode loop 100 includes a sensing circuit 150 for sensing the voltage level at the first node 120 and the second node 130. An averaging circuit 160 is coupled to the sensing circuit 150 to produce an averaged voltage signal 165 which is an average of the voltages sensed at the first node 120 and the second node 130. A comparing circuit 170 is coupled to receive the averaged voltage signal 165 from the averaging circuit 160.

The comparing circuit 170 compares the averaged voltage signal 165 to a reference signal 172 to produce a control output signal 175. The control output signal 175 is provided to a feedback current source 180. The feedback current source 180 provides an adjustment signal 105 to the first node 120 of the loop filter 110.

Figure 4:
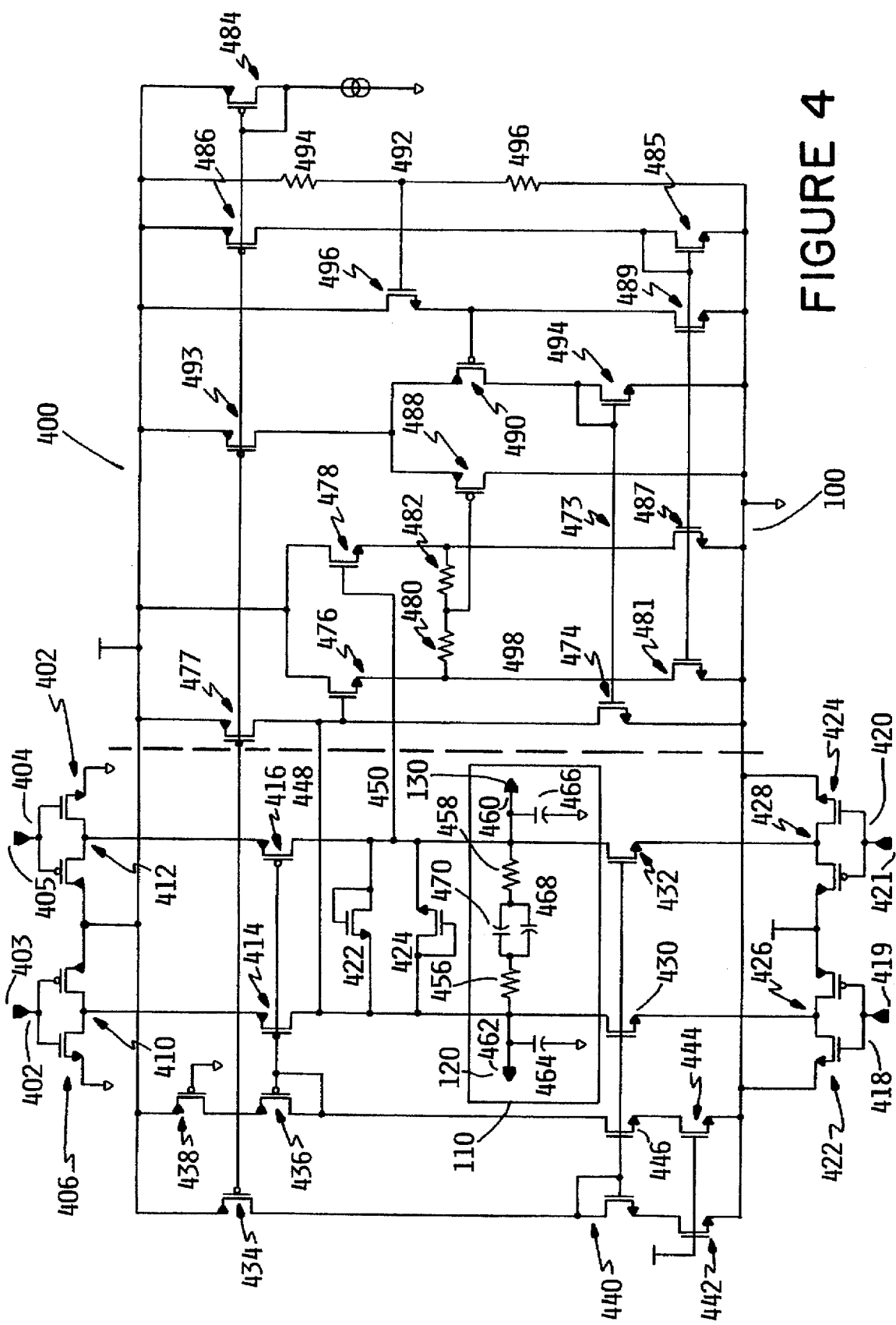
FIG. 4 is a schematic diagram of a charge pump according to an embodiment of the present invention.

FIG. 4 illustrates a schematic for a particular embodiment of the charge pump 400 according to the present invention. The current switch includes a first differential pairs set 414 and 416, and a second differential pair set 430 and 432. The loop filter 110 is coupled to the differential pairs 414, 416, 430, 432 forming the current switch. The common-mode loop 100 senses the charge signals from the current switch and adjusts the voltage level at the first node 120 of the loop filter 110.

The differential pairs receive complimentary metal-oxide semiconductor (CMOS) voltage levels from a phase or error detector. Scaling transistor 434 can be scaled to adjust the peak current needed for a particular application. Transistor 440 generates the reference voltage for the switched current sources 430 and 432. Transistor 446 mirrors the current up to the switched field effect transistors, 414 and 416. The particular embodiment illustrated in FIG. 4 uses inverters 402, 404, 418, and 420 to charge the sources of 430, 432, 414, and 416 up and down to turn them on or off. The inverters 402, 404, 418, and 420 add source resistance to the differential pairs 414, 416, 430, and 432 forming the switched current source. This added source resistance must be reflected in the reference and mirror provided by transistors 442, 444, and 438 to maintain the current matching.

When an UP pulse from the control circuit, which is not shown, is applied, the UP input 421 is high and UPB input 403 is low. Consequently, node 410 is high and node 428 is low causing the current sources 414 and 432 to turn on. These two currents are matched and cause nodes FILTP 462 and FILTN 460 to charge equally up and down, respectively. If a DOWN pulse from the control circuit 80 is present, the DN input 419 is high and DNB input 405 is low, so that node 412 is high and node 426 is low causing the current sources 430 and 416 to turn on. These two currents are matched and cause nodes FILTN 460 and FILTP 462 to charge equally up and down, respectively. When no correction pulses are being delivered, all of the switched current sources 414, 416, 430, and 432 are off and the only current into the loop filter 110 is leakage current.

In the particular embodiment illustrated in FIG. 4, the loop filter 110 consists of capacitors 464, 466, 470, 468, and resistors 456, and 458. The loop filter 110 is wired in the circuit to provide for the least amount of capacitor area while still compensating the common-mode loop for stability.

Capacitors 470 and 468 make up the dominant pole for the charge pump 400 and are relatively large so they are wired differentially between the differential pairs 414, 416, 430, and 432. Capacitors 470 and 468 would work if they were wired single ended to ground, but would then take up twice as much area for the same response. The high frequency pole made from the capacitors 464 and 466 are wired single ended to ground since they are needed to compensate the common-mode loop as well as reduce the ripple on the control voltage. This takes more area but is not significant with respect to the area required for 470 and 468.

As illustrated in FIG. 4, the source followers 476 and 478 sense the differential control voltage across the loop filter 110 and the average voltage is taken from the center of the resistor divider of resistor 480 and resistor 482. This average is compared to a common-mode reference 492 generated by resistor 494 and resistor 496. The differential pair of transistor 488 and transistor 490 compare the sensed average to the level shifted reference 492 and deliver a feedback signal 473 to the current source 474. Current source 474 adjusts the level of node FILTP 462 through common-mode feedback signal 498 by working against field effect transistor 472. Thus, the common-mode feedback signal 498 of the common-mode loop 100 drives one side of the differential control voltage. Node FILTN 460 is not controlled by the common-mode feedback signal 498.

If transistors 474 and 472 were duplicated so that both nodes FILTP 462 and FILTN 460 were being driven by the feedback signal 498, the charge pump 400 would have a static error term for two reasons. First, the charge pump 400 would have a static error term because the finite output impedance of the current sources driving FILTN 460 and FILTP 462 have a tendency to charge those nodes to the common-mode reference value. Second, the charge pump 400 would have static error term because of mismatches between the transistor pair 474, 472 and its duplicate pair. In both cases, a steady state current is induced which results in a static error to offset it. Therefore, by only driving one side of the control voltage signal, the only static error terms are due to mismatches in the up and down currents from the switches.

Figure 5:
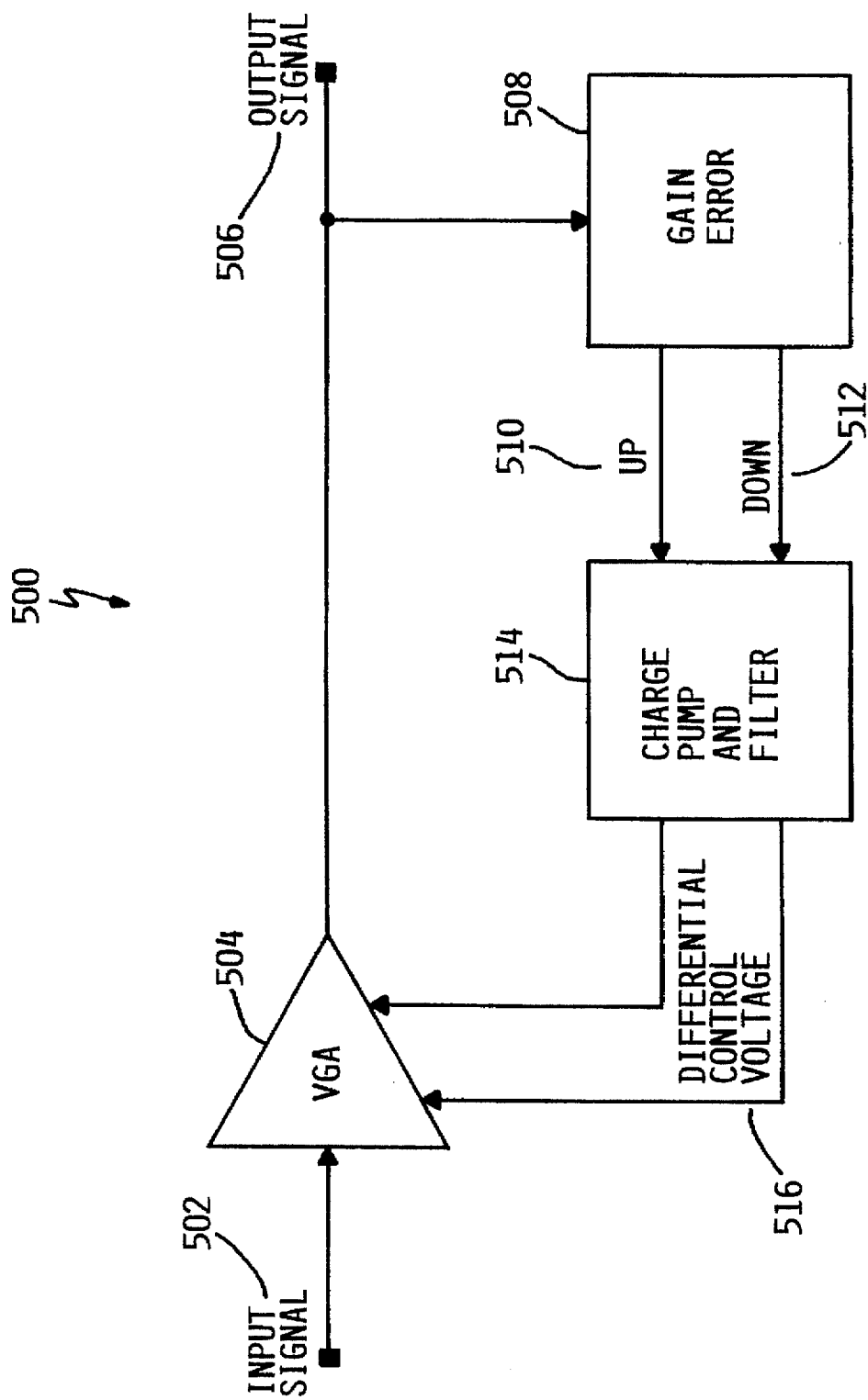
FIG. 5 is a block diagram of a gain control loop according to another embodiment of the present invention.

FIG. 5 is a block diagram of a gain control loop 500 according to another embodiment of the present invention. In FIG. 5 a signal source, which is not shown, provides an input signal 502 to a variable gain amplifier (VGA) 504 in the gain control loop 500. The output signal 506 of the variable gain amplifier 504 is monitored by a gain error circuit 508. The gain error circuit 508 generates a differential pump up signal 510 or a differential pump down signal 512 which is applied to the charge pump and loop filter circuit 514. The differential pump up signal 510 and differential pump down signal 512 are a function of the amplitude of the output signal 506 from the variable gain amplifier 504. The charge pump and loop filter 514 provide a differential control voltage 516 to the variable gain amplifier 504. The differential control voltage 516 adjusts the gain of the variable gain amplifier 504 so that the output signal 506 can be maintained at a specified level as determined by the gain error circuit 508.

The foregoing description of the exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A charge pump with low static error, comprising:

a current switch for receiving a control signal from a control circuit and for generating a charge signal in response to the control signal;

a loop filter, coupled to the current switch, for receiving the charge signal at a first and second node, the charge signal adjusting a voltage at the first and at the second node in response to the control signal from the control circuit; and a common-mode loop, coupled to the current switch, for sensing the charge signal from the current switch and for providing a voltage level adjustment signal to the first node of the loop filter in response thereto.

2. The charge pump of claim 1, wherein the charge signal comprises an increase control signal.

3. The charge pump of claim 2, wherein the increase control signal comprises a signal for increasing the voltage at the first node and decreasing the voltage at the second node.

4. The charge pump of claim 1, wherein the charge signal comprises a decrease control signal.

5. The charge pump of claim 4, wherein the decrease control signal comprises a signal for decreasing the voltage at the first node and increasing the voltage at the second node.

6. The charge pump of claim 1, wherein the common-mode loop comprises:

a sensing circuit coupled to the first node and second node of the loop filter for sensing the voltage level at the first and second node;

an averaging circuit, coupled to the sensing circuit, for producing an averaged voltage signal;

a comparing circuit, coupled to the averaging circuit, for comparing the averaged voltage signal to a reference signal to produce a control output signal; and a feedback current source, coupled to the comparing circuit, the feedback current source adjusting the voltage level at the first node of the loop in response to the control output signal.

7. The charge pump of claim 1, wherein the current switch comprises:
   a first differential pair; and
   a second differential pair;
   wherein the first differential pair increases the voltage at the first node and the second differential pair decreases the voltage on the second node of the loop filter, in response to an increase control signal.

8. The charge pump of claim 1, wherein the current switch comprises:
   a first differential pair; and
   a second differential pair;
   wherein the first differential pair increases the voltage at the second node and the second differential pair decreases the voltage on the first node of the loop filter, in response to a decrease control signal.

9. The charge pump of claim 1 further comprising an inverter for receiving the control signal, the inverter coupled to the current switch to provide an inverted control signal to the current switch, to provide source resistance to the current switch for maintaining current balance and to reduce overshoot of the charge signal to the loop filter.

10. A charge pump with low static error, comprising:
    current switch for receiving a control signal from a control circuit and for generating a charge signal in response to the control signal;
    a loop filter, coupled to the current switch, for receiving the charge signal at a first and second node, the charge signal adjusting a voltage at the first and at the second node in response to the control signal from the control circuit; and
    a common-mode loop, coupled to the current switch, for sensing the charge signal from the current switch and for providing an voltage level adjustment signal to the first node of the loop filter in response thereto, the common-mode loop comprising:
       a sensing circuit coupled to the first node and second node of the loop filter for sensing the voltage level at the first and second node;
       an averaging circuit, coupled to the sensing circuit, for producing an averaged voltage signal;
       a comparing circuit, coupled to the averaging circuit, for comparing the averaged voltage signal to a reference signal to produce a feedback control output signal; and
       a feedback current source, coupled to the comparing circuit, the feedback current source adjusting the voltage level at the first node of the loop in response to the feedback control output signal.

11. The charge pump of claim 10, wherein the charge signal comprises an increase control signal.

12. The charge pump of claim 11, wherein the increase control signal comprises a signal for increasing the voltage at the first node and decreasing the voltage at the second node.

13. The charge pump of claim 10, wherein the charge signal comprises a decrease control signal.

14. The charge pump of claim 13, wherein the decrease control signal comprises a signal for decreasing the voltage at the first node and increasing the voltage at the second node.

15. The charge pump of claim 10, wherein the current switch comprises:
    a first differential pair; and
    a second differential pair;
    wherein the first differential pair increases the voltage at the first node and the second differential pair decreases the voltage on the second node of the loop filter, in response to an increase control signal.

16. The charge pump of claim 10, wherein the current switch comprises:
    a first differential pair; and
    a second differential pair;
    wherein the first differential pair increases the voltage at the second node and the second differential pair decreases the voltage on the first node of the loop filter, in response to a decrease control signal.

17. The charge pump of claim 10 further comprising an inverter for receiving the control signal, the inverter coupled to the current switch to provide an inverted control signal to the current switch and to provide source resistance to the current switch for maintaining current balance.

18. A phase-locked loop, comprising:
    a control circuit for receiving an input signal and providing an output control signal;
    a charge pump, coupled to the control circuit, for receiving the control signal, wherein the charge pump comprises:
       a current switch for receiving the output control signal from the control circuit and for generating a charge signal in response thereto;
       a loop filter, coupled to the current switch, for receiving the charge signal at a first and second node, the charge signal adjusting a voltage at the first and at the second node in response to the control signal from the control circuit; and
       a common-mode loop, coupled to the current switch, for sensing the charge signal from the current switch and for providing an voltage level adjustment signal to the first node of the loop filter in response thereto; and
    a voltage controlled oscillator, coupled to the first and second node of the loop filter, the voltage controlled oscillator producing a voltage controlled oscillator feedback signal to the control circuit in response to the voltage at the first and second nodes.

19. The phase-locked loop of claim 18, wherein the common-mode loop comprises:
    a sensing circuit coupled to the first node and second node of the loop filter for sensing the voltage level at the first and second node;
    an averaging circuit, coupled to the sensing circuit, for producing an averaged voltage signal;
    a comparing circuit, coupled to the averaging circuit, for comparing the averaged voltage signal to a reference signal to produce a feedback control output signal; and
    a feedback current source, coupled to the comparing circuit, the feedback current source adjusting the voltage level at the first node of the loop in response to the feedback control output signal.

20. The phase-locked loop of claim 18, wherein the current switch comprises:
    a first differential pair; and
    a second differential pair;
    wherein the first differential pair increases the voltage at the first node and the second differential pair decreases the voltage on the second node of the loop filter, in response to an increase control signal.

21. The phase-locked loop of claim 18, wherein the current switch comprises:

a first differential pair; and a second differential pair;

wherein the first differential pair increases the voltage at the second node and the second differential pair decreases the voltage on the first node of the loop filter, in response to a decrease control signal.

22. The phase-locked loop of claim 18, wherein the current switch further comprises an inverter for receiving the control signal, the inverter coupled to the current switch to provide an inverted control signal to the current switch and to provide source resistance to the current switch for maintaining current balance.

23. The phase-locked loop of claim 18, wherein the control circuit comprises a phase detector.

24. The phase-locked loop of claim 18, wherein the control circuit comprises a frequency detector.

25. A method for charging a loop filter in a phase-locked loop to minimize static error, comprising the steps of:

receiving a control signal from a control circuit;

providing a charge signal to a first and second node of a loop filter in response to the control signal;

sensing the charge signal; and adjusting the charge signal on the first node in response to sensing the charge signal.

26. The method of claim 25, wherein the step of adjusting the charge signal further comprises the steps of comparing the sensed charge signal to a reference signal, producing a feedback control signal in response to the comparison, and adjusting a feedback current source to vary the charge signal at the first node in response to the feedback control signal.

27. A gain control loop, comprising:

a variable gain amplifier for receiving an input signal and providing an amplified output signal having an amplitude dependent on the gain of the amplifier;

a gain error circuit, coupled to the variable gain amplifier, for measuring the amplitude of the amplified output signal to maintain the amplified output signal at a predetermined amplitude, the gain error circuit generating a control signal in response to the measured amplitude; and a charge pump, coupled to the gain error circuit, for receiving the control signal, wherein the charge pump comprises:

a current switch for receiving the control signal from the gain error circuit and for generating a charge signal in response to the control signal;

a loop filter, coupled to the current switch and the variable gain amplifier, for receiving the charge signal at a first and second node, the charge signal adjusting a voltage at the first and at the second node in response to the control signal from the gain error circuit, the voltage at the first and at the second node adjusting the gain of the variable gain amplifier to maintain the amplified output signal at the predetermined amplitude; and a common-mode loop, coupled to the current switch, for sensing the charge signal from the current switch and for providing an adjustment signal to the first node of the loop filter for adjusting the voltage at the first and second node of the loop filter in response to the sensed charge signal.

28. The gain control loop of claim 27, wherein the common-mode loop comprises:

a sensing circuit coupled to the first node and second node of the loop filter for sensing the voltage level at the first and second node;

an averaging circuit, coupled to the sensing circuit, for producing an averaged voltage signal;

a comparing circuit, coupled to the averaging circuit, for comparing the averaged voltage signal to a reference signal to produce a feedback control output signal; and a feedback current source, coupled to the comparing circuit, the feedback current source adjusting the voltage level at the first node of the loop in response to the feedback control output signal.

29. The gain control loop of claim 27, wherein the current switch comprises:

a first differential pair; and a second differential pair;

wherein the first differential pair increases the voltage at the first node and the second differential pair decreases the voltage on the second node of the loop filter, in response to an increase control signal.

30. The gain control loop of claim 27, wherein the current switch comprises:

a first differential pair; and a second differential pair;

wherein the first differential pair increases the voltage at the second node and the second differential pair decreases the voltage on the first node of the loop filter, in response to a decrease control signal.

31. The gain control loop of claim 27, wherein the current switch further comprises an inverter for receiving the control signal, the inverter coupled to the current switch to provide an inverted control signal to the current switch and to provide source resistance to the current switch for maintaining current balance.

32. The gain control loop of claim 27, wherein the control signal is a function of the amplitude of the output signal.

* * * * *